United States Patent [19]

Horikawa

[11] Patent Number: 4,978,197

[45] Date of Patent: Dec. 18, 1990

[54] BEAM-COMBINING LASER BEAM SOURCE DEVICE

[75] Inventor: Kazuo Horikawa, Kanagawa, Japan

[73] Assignee: Fuji Photo Film Co., Ltd., Kanagawa, Japan

[21] Appl. No.: 397,817

[22] Filed: Aug. 24, 1989

[30] Foreign Application Priority Data

Aug. 26, 1988 [JP] Japan ................. 63-212233

[51] Int. Cl.[5] .................. G02B 27/14; G02B 7/02
[52] U.S. Cl. .................. 350/174; 350/252
[58] Field of Search ............. 350/169, 171, 174, 245, 350/252, 253, 255

[56] References Cited

U.S. PATENT DOCUMENTS 4,701,018 10/1987 Louks .................. 350/174

FOREIGN PATENT DOCUMENTS 0030856 3/1979 Japan .................. 350/174
56-11395 2/1981 Japan .

OTHER PUBLICATIONS

IBM Technical Disclosure Bulletin, vol. 15, No. 4, Sep. 1972, "Light Beam Combiner", J. J. Wylle.
"Toshiba Review", vol. 42, No. 10, 1987, Optical Pickup Head, TOPH 7850 Series.
"Sanyo Technical Review", vol. 20, No. 1, Feb. 1988, Thin Microsize CD Pickup.

Primary Examiner—Bruce Y. Arnold
Assistant Examiner—Ronald M. Kachmarik
Attorney, Agent, or Firm—Sughrue, Mion, Zinn, Macpeak & Seas

[57] ABSTRACT

A beam-combining laser beam source device comprising first and second laser beam source sections, each of which includes laser beam sources, a collimator optical system and optical path adjusting elements, and a beam-combining optical element. Each collimator optical system is constituted of lens groups corresponding to the laser beam sources, and a common lens positioned so that the laser beams, which have been radiated from the optical path adjusting elements along optical paths parallel and close to one another, impinge upon the common lens. The common lenses are moveable along first directions parallel to their optical axes and along second directions normal to the optical axes. The laser beams which have been radiated from the first laser beam source section and those radiated from the second laser beam source section are moved along directions normal to each other in the optical paths of the laser beams, which have been combined by the movement of the common lenses of the first and second laser beam source sections along the second directions.

6 Claims, 2 Drawing Sheets

F I G. 1
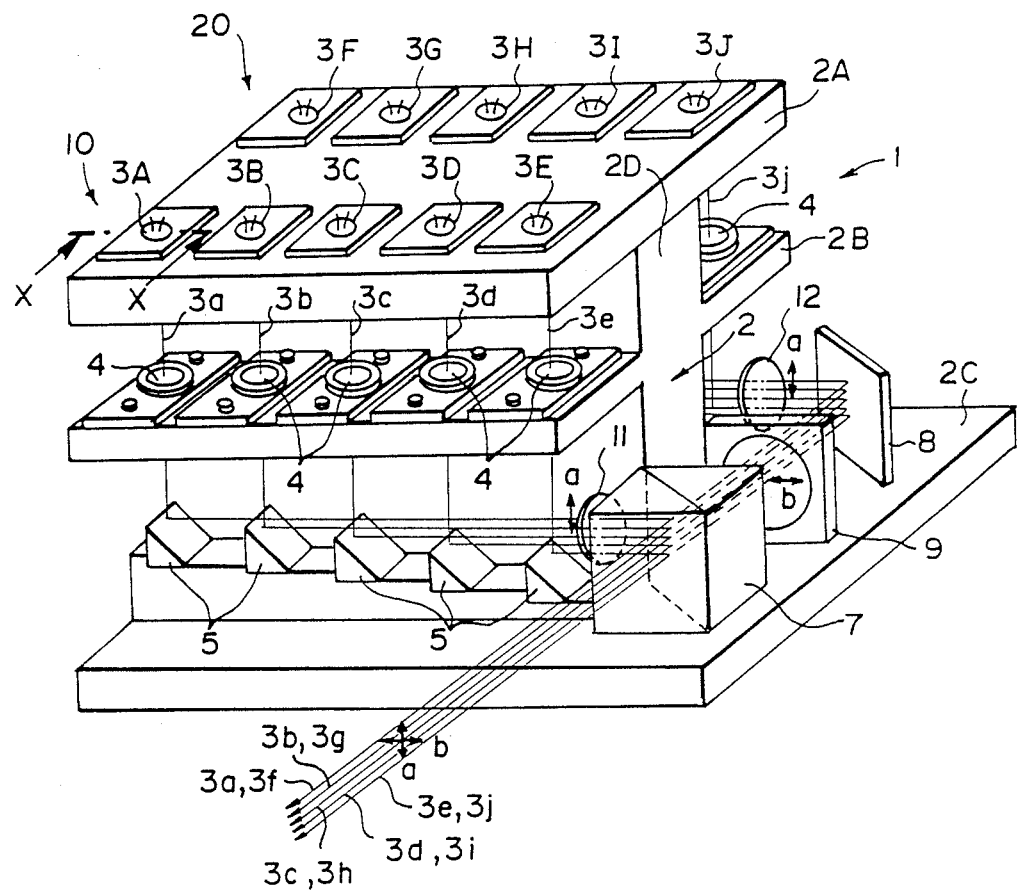

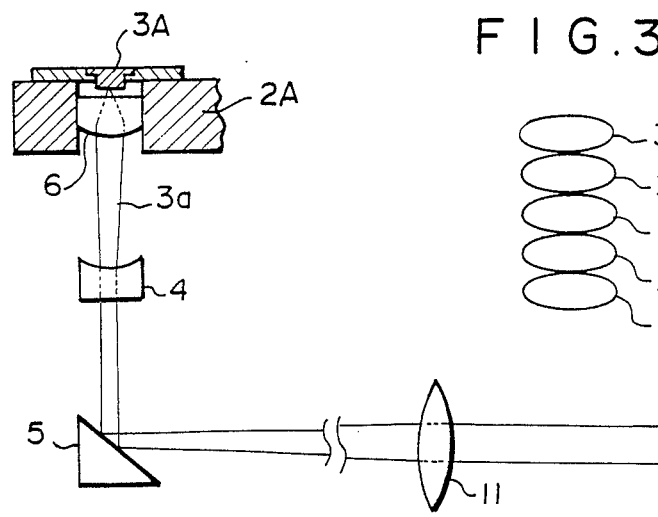
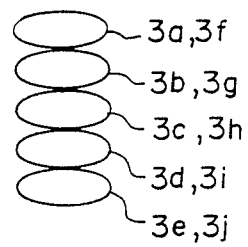
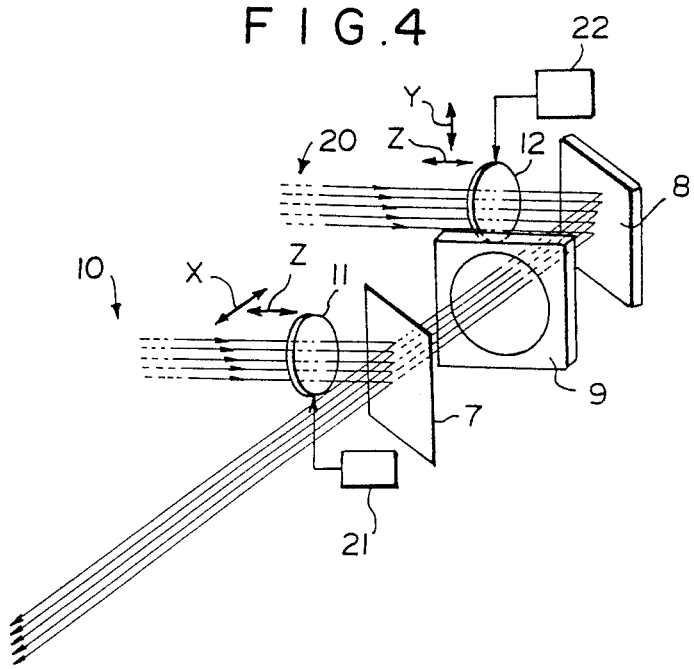

BEAM-COMBINING LASER BEAM SOURCE DEVICE

BACKGROUND OF THE INVENTION

1. Field of the Invention

This invention generally relates to a beam-combining laser beam source device wherein laser beams, produced by a plurality of laser beam sources such as semiconductor lasers which have a low power output, are combined so as to multiply the power of the individual lasers. This invention particularly relates to a beam-combining laser beam source device wherein positions of laser beams are adjusted easily in order to combine the laser beams.

2. Description of the Prior Art

Light beam scanning apparatuses, wherein a laser beam is deflected by a light deflector in order to scan a surface with the laser beam, have heretofore been widely used in, for example, scanning recording apparatuses and scanning read-out apparatuses. In such light beam scanning apparatuses, it is desired that a plurality of laser beams be combined so as to obtain laser beams having a high intensity and those laser beams having a high intensity be used as scanning light in order to, for example, increase the speed at which the information recorded on a surface to be scanned is recorded or read out. Combination cf the laser beams is required particularly when semiconductor lasers are used as the laser beam sources. Specifically, a semiconductor laser has various advantages over a gas laser or the like in that the semiconductor laser is small in size, cheap and consumes little power, and that the laser beam can be modulated directly when the drive current applied to the semiconductor laser is changed.

However, the output power of the semiconductor laser is low (20 mW to 30 mW) when the semiconductor laser is operated in order to continuously radiate the laser beam. Therefore, the semiconductor laser is not suitable for use in a light beam scanning apparatus wherein scanning light having a high energy is necessary, for example: a scanning recording apparatus wherein information is recorded on a recording material which has a low sensitivity, such as a draw material (a metal film, an amorphous film, or the like).

On the other hand, when certain kinds of phosphors are exposed to radiation such as X-rays, $\alpha$rays, $\beta$-rays, $\gamma$-rays, cathode rays or ultraviolet rays, they store part of the energy of the radiation. Then, when the phosphor which has been exposed to the radiation is exposed to stimulating rays such as visible light, light is emitted by the phosphor in proportion to the amount of energy stored during exposure to the radiation. A phosphor exhibiting such properties is referred to as a stimulable phosphor. In U.S. Pat. Nos. 4,258,264, 4,276,473, 4,315,318 and 4,387,428 and Japanese Unexamined Patent Publication No. 56(1981)-11395, using a stimulable phosphor in a radiation image recording and reproducing system was proposed. Specifically, a sheet provided with a layer of the stimulable phosphor (hereinafter referred to as a stimulable phosphor sheet) is first exposed to radiation which has passed through an object such as the human body in order to store a radiation image of the object thereon, and is then scanned with stimulating rays such as a laser beam which cause it to emit light in proportion to the amount of energy stored during exposure to the radiation. The light emitted by the stimulable phosphor sheet upon stimulation thereof is photoelectrically detected and converted into an electric image signal, and the image signal is used to reproduce the radiation image of the object as a visible image on a recording material such as photographic film, a display device such as a cathode ray tube (CRT), or the like.

In the aforesaid radiation image recording and reproducing system, it is desired to use a light beam scanning apparatus, wherein a semiconductor laser is used, in order to scan the stimulable phosphor sheet on which a radiation image has been stored, and to thereby read out the radiation image. However, in order to quickly read out the radiation image from the stimulable phosphor sheet, it is necessary to irradiate stimulating rays having a sufficiently high energy onto the stimulable phosphor sheet. Accordingly, it is not always possible to use a light beam scanning apparatus, wherein a semiconductor laser is used, in order to read out an image in the radiation image recording and reproducing system.

In order to obtain a scanning laser beam having a sufficiently high energy from a semiconductor laser, or the like, having a low power outputs, a plurality of laser beam sources may be used, and laser beams radiated from the laser beam sources may be combined so as to multiply the power of the individual laser beam sources.

In general, in order to combine the laser beams produced by a plurality of laser beam sources, the laser beams produced by the laser beam sources are collimated respectively by collimator lenses, guided along optical paths parallel and close to one another, and converged to a common spot by a converging lens. Therefore, in order to accurately combine the laser beams, it is necessary to control the positions of the laser beams before they impinge upon the converging lens, so that they are accurately collimated and positioned along predetermined optical paths close to one another. In general, in order to control the positions of the laser beams, the positions of the respective collimator lenses are finely adjusted.

However, in cases where the collimator lenses corresponding to the respective laser beams to be combined are moved in order to adjust the positions of the laser beams, position adjustment must be carried out for the same number of the collimator lenses as the number of the laser beam sources. Therefore, much time and labor are required to adjust the positions. Also, because the position adjustment must be carried out in three directions for each of the collimator lenses very complicated, expensive mechanisms must be provided to move the respective collimator lenses in three directions.

SUMMARY OF THE INVENTION

The primary object of the present invention is to provide a beam-combining laser beam source device with a plurality of laser beam sources, wherein positions of laser beams are adjusted easily and accurately.

Another object of the present invention is to provide a beam-combining laser beam source device with a plurality of laser beam sources, wherein positions of laser beams are adjusted with an inexpensive mechanism.

The present invention provides a beam-combining laser beam source device comprising a first laser beam source section and a second laser beam source section, each of which comprises:

(i) a plurality of laser beam sources, (ii) a collimator optical system positioned in optical paths of laser beams which are radiated from the laser beam sources in order to collimate the laser beams, and (iii) optical path adjusting elements respectively positioned in the optical paths of the laser beams in order to radiate the laser beams along optical paths parallel and close to one another, so that the laser beams radiated from the first laser beam source section and the second laser beam source section are caused to impinge upon a beam-combining optical element from different directions and are combined by the beam-combining optical element, the beam-combining optical element reflecting the laser beams radiated from one of the first laser beam source section and the second laser beam source section and transmitting the laser beams radiated from the other of the first laser beam source section and the second laser beam source section, wherein each of said collimator optical systems of said first laser beam source section and said second laser beam source section is constituted of lens groups, each of which is composed of a plurality of lenses corresponding to each of said laser beam sources, and a common lens positioned so that the laser beams, which have been radiated from said optical path adjusting elements along the optical paths parallel and close to one another, impinge upon said common lens, the common lens of said first laser beam source section is moveable along a first direction which is parallel to the optical axis of said common lens, and along a second direction which is normal to said optical axis, the common lens of said second laser beam source section is moveable along a first direction which is parallel to the optical axis of said common lens, and along a second direction which is normal to said optical axis, and the laser beams which have been radiated from said first laser beam source section and the laser beams which have been radiated from said second laser beam source section are moved along directions normal to each other in the optical paths of the laser beams, which have been combined by the movement of said common lens of said first laser beam source section along said second direction and the movement of said common lens of said second laser beam source section along said second direction.

The term "combining laser beams" as used herein means that a plurality of collimated laser beams are combined parallel and close to one another so that they can impinge upon a single converging lens or the like. In cases where the direction in which the laser beams radiated from the first laser beam source section are polarized and the direction in which the laser beams radiated from the second laser beam source section are polarized are normal to each other, a polarization beam splitter is used as the beam-combining optical element. In cases where the wavelengths of the laser beams radiated from the first laser beam source section and the wavelengths of the laser beams radiated from the second laser beam source section are different from each other, a dichroic mirror is used as the beam-combining optical element. Each of the common lenses of the first laser beam source section and the second laser beam source section may be constituted of a single lens. Alternatively, each of the common lenses may be constituted of a plurality of lenses insofar as the lenses are positioned so that a plurality of the laser beams radiated from the corresponding laser beam source section impinge upon the lenses, and the lenses have the lens effects common to the laser beams and are moved together with one another.

With the beam-combining laser beam source device in accordance with the present invention, a plurality of laser beam sources are classified into the first and second laser beam source sections. In both the first laser beam source section and the second laser beam source section, a plurality of laser beams are radiated along optical paths which are parallel and close to one another. Thereafter, the laser beams radiated from the first laser beam source section and the laser beams radiated from the second laser beam source section are combined by the beam-combining optical element. Therefore, a common optical element can be positioned in the optical paths of the laser beams, which optical paths are parallel and close to one another, in each of the first laser beam source section and the second laser beam source section so that the laser beams can impinge upon the common optical element. Accordingly, each of the collimator optical systems of the first laser beam source section and the second laser beam source section can be constituted of the lens groups and the common lens. With this configuration, the common lens alone may be moved in order to adjust the positions of the laser beams in each laser beam source section. Adjustment of the position of the common lens along its optical axis can be carried out for both common lenses of the first laser beam source section and the second laser beam source section in order to adjust the points at which the laser beams are focused. Also, the adjustment of the positions of the laser beams, which have been radiated from the first laser beam source section and the second laser beam source section, in one of the two directions normal to each other in the optical paths of the laser beams, which have been combined, can be achieved by the movement of one of the common lenses of the first laser beam source section and the second laser beam source section along the aforesaid second direction normal to the optical axis of the common lens. The adjustment of the positions of the laser beams, which have been radiated from the first laser beam source section and the second laser beam source section, in the other of the two directions normal to each other in the optical paths of the laser beams, which have been combined, can be achieved by the movement of the other common lens along its second direction normal to the optical axis. Therefore, it is only necessary that each common lens be moved in two directions, and the positions of the laser beams can be adjusted very easily with movement means which are cheap and have a simple mechanism.

BRIEF DESCRIPTION OF THE DRAWINGS

FIG. 1 is a perspective view showing an embodiment of the beam-combining laser beam source device in accordance with the present invention, FIG. 2 is a sectional view taken along line X—X in FIG. 1, FIG. 3 is a schematic view showing cross-sections of laser beams radiated from the embodiment shown in FIG. 1, and FIG. 4 is a schematic view showing how the convex lenses are moved in the embodiment shown in FIG. 1.

DESCRIPTION OF THE PREFERRED EMBODIMENTS

The present invention will hereinbelow be described in further detail with reference to the accompanying drawings.

With reference to FIG. 1, a beam-combining laser beam source device 1 comprises ten semiconductor lasers 3A, 3B, 3C, 3D, 3E, 3F, 3G, 3H, 3I and 3J which are positioned in two rows and secured to an upper plate 2A of support 2 so that their axes of laser beam emission are approximately parallel one another. Ten concave lenses 4, 4, . . . are secured to a middle plate 2B of the support 2 so that they face the semiconductor lasers 3A through 3J. Also, ten prism mirrors 5, 5, . . . acting as optical path adjusting elements are secured to a lower plate 2C of the support 2 so that they face the concave lenses 4, 4, . . . In this embodiment, a first laser beam source section 10 is constituted of the semiconductor lasers 3A through 3E, and the optical elements such as the concave lenses 4, 4, . . . and the prism mirrors 5, 5, which are positioned in the optical paths of laser beams 3a through 3e radiated from the semiconductor lasers 3A through 3E. The second laser beam source section 20 is constituted of the semiconductor lasers 3F through 3J, and the optical elements such as the concave lenses 4, 4, . . . and the prism mirrors 5, 5, . . . which are positioned in the optical paths of laser beams 3f through 3j radiated from the semiconductor lasers 3F through 3J. The elements of the first laser beam source section 10 and the elements of the second laser beam source section 20 are positioned symmetrically with respect to a wall member 2D of the support 2, wall member 2D supporting the upper plate 2A, the middle plate 2B and the lower plate 2C.

Convex lenses 6, 6, . . . (not shown in FIG. 1) are provided inside the upper plate 2A so that they face the semiconductor lasers 3A through 3J. (By way of example, FIG. 2 shows the convex lens 6 facing the semiconductor laser 3A.) In both the first laser beam source section 10 and the second laser beam source section 20, each of the lens groups of a collimator optical system is constituted of the concave lens 4 and the convex lens 6.

In the first laser beam source section 10, the laser beams 3a through 3e, produced by the semiconductor lasers 3A through 3E are caused to pass through the corresponding convex lenses 6, 6, . . . and the corresponding concave lenses 4, 4, . . . , and are then reflected by the corresponding prism mirrors 5, 5, . . . The semiconductor lasers 3A through 3E are positioned so as to radiate the laser beams 3a through 3e in a single plane. Also, the prism mirrors 5, 5, . . . provided in the optical paths of the laser beams 3a through 3e are vertically deviated little by little from one another as shown in FIG. 1. Therefore, the positions from which the laser beams 3a through 3e are reflected by the prism mirrors 5, 5, . . . vary little by little only in the vertical direction, and the laser beams 3a through 3e after being reflected by the prism mirrors 5, 5, . . . follow optical paths which are parallel and very close to one another in the vertical direction. A single convex lens 11 which acts as a common lens is positioned in the optical paths of the laser beams 3a through 3e, whose optical paths are parallel and close to one another. The laser beams 3a through 3e pass through the convex lens 11, and then impinge upon a polarization beam splitter 7 which is positioned in the optical paths of the laser beams 3a through 3e. In the first laser beam source section 10, the collimator optical system is constituted of the lens groups, each of which is composed of the convex lens 6 and the concave lens 4, and the single convex lens 11. As shown in FIG. 2, the laser beam 3a, produced by the semiconductor laser 3A, is caused to pass through and is collimated by the convex lens 6, the concave lens 4 and the convex lens 11. In the same manner, the laser beams 3b through 3e produced by the semiconductor lasers 3B through 3E are collimated by the convex lenses 6, 6, . . . and the concave lenses 4, 4, . . . , which are respectively positioned in the optical paths of the laser beams 3b through 3e, and by the convex lens 11. The focal lengths or the positions of the convex lenses 6, 6, . . . and the concave lenses 4, 4, . . . are varied little by little so that the laser beams 3a through 3e, radiated along the optical paths of which lengths up to the convex lens 11 are different from one another follow the parallel optical paths after being radiated from the convex lens 11.

Also, in the second laser beam source section 20 provided on the rear side of the wall member 2D, in the same manner as that in the first laser beam source section 10, the laser beams 3f through 3j produced by the semiconductor lasers 3F through 3J are reflected by the prism mirrors 5, 5, . . . and then follow optical paths which are parallel and very close to one another in the vertical direction. The laser beams 3f through 3j are collimated by convex lenses 6, 6, . . . and concave lenses 4, 4, . . . , which are respectively positioned in the optical paths of the laser beams 3f through 3j, and by a single convex lens 12 which acts as a common lens and which is positioned in the optical paths of the laser beams 3f through 3j.

In the first laser beam source section 10 and the second laser beam source section 20, as for the laser beams produced by each pair of the semiconductor lasers provided facing each other with the wall member 2D intervening therebetween (i.e. the laser beams 3a and 3f, the laser beams 3b and 3g, and so on), the heights of the respective pairs of laser beams are equal to each other after the laser beams have been reflected by corresponding prism mirrors 5, 5. Furthermore, the semiconductor lasers 3A through 3J are secured to the upper plate 2A so that the directions of polarization of the laser beams 3a through 3j, after being reflected by the prism mirrors 5, 5, . . . , are the same (i.e. the direction coincides with the direction indicated by the arrow "a" in FIG. 1).

The polarization beam splitter 7 reflects light polarized in the direction indicated by the arrow "a". Therefore, the laser beams 3a through 3e are reflected by the polarization beam splitter 7. On the other hand, the laser beams 3f through 3j are reflected by a mirror 8 so that the directions of their optical paths are changed by an angle of approximately 90°. Then, the laser beams 3f through 3j are passed through a halfwave plate 9 so that the direction of polarization is changed by an angle of 90°, and the laser beams 3f through 3j are converted to light polarized in the direction indicated by the arrow "b". The polarization beam splitter 7 transmits light polarized in the direction indicated by the arrow "b". Therefore, the laser beams 3f through 3j, after being polarized in the direction indicated by the arrow "b", pass through the polarization beam splitter 7. The laser beam 3f is radiated along the same optical path as the laser beam 3a, and the laser beam 3g is radiated along the same optical path as the laser beam 3b. Also, the laser beam 3h is radiated along the same optical path as the laser beam 3c, the laser beam 3i is radiated along the same optical path as the laser beam 3d, and the laser beam 3j is radiated along the same optical path as the laser beam 3e. FIG. 3 shows cross-sections of the laser beams 3a through 3j combined and radiated along the optical paths parallel and close to one another.

In order to accurately combine the laser beams 3a through 3e, which have been radiated from the first laser beam source section 10, with the laser beams 3f through 3j which have been radiated from the second laser beam source section 20, it is necessary to control the positions of the laser beams 3a through 3j and the points at which the laser beams 3a through 3j are focused so that all laser beams 3a through 3j are collimated and the laser beams 3a through 3e and the laser beams 3f through 3j respectively overlap one upon the other. In the beam-combining laser beam source device 1, the convex lenses 11 and 12 of the first laser beam source section 10 and the second laser beam source section 20 are moved in two directions in order to adjust the positions of the laser beams 3a through 3j and the points at which the laser beams 3a through 3j are focused.

Specifically, as shown in FIG. 4, the convex lens 11 of the first laser beam source section 10 and the convex lens 12 of the second laser team source section 20 are connected to movement means 21 and 22 respectively. The convex lens 11 can be moved by the movement means 21 along a first direction indicated by the arrow Z whose direction is parallel to the optical axis of the convex lens 11, and along a second direction indicated by the arrow X whose direction is normal to the first direction Z. The convex lens 12 can be moved by the movement means 22 along a first direction indicated by the arrow Z whose direction is parallel to the optical axis of the convex lens 12, and along a second direction indicated by the arrow Y whose direction is normal to both the first direction Z and the direction X. As the movement means 21 and 22, it is possible to use the means having the same mechanism as an actuator for known optical elements, for example, an actuator used to move an optical system in a pickup device of a compact disk player, as disclosed in "Sanyo Technical Review", Vol. 20, No. 1, Feb. 1988, pp. 30–40, and "Toshiba Review", Vol. 42, No. 10, 1987, pp. 797–800.

In the course of the adjustment of the positions of the laser beams 3a through 3j and the focusing of the points at which the laser beams 3a through 3j, the convex lens 11 of the first laser beam source section 10 is moved along the first direction Z so that the laser beams 3a through 3e are accurately collimated. Also, the convex lens 12 of the second laser beam source section 20 is moved along the first direction Z so that the laser beams 3f through 3j are accurately collimated. Thereafter, in order to adjust the positions of the laser beams 3a through 3j in the horizontal direction, the positions of the laser beams 3f through 3j radiated from the second laser beam source section 20 are taken as the reference, and the convex lens 11 of the first laser beam source section 10 is moved along the second direction X until the laser beams 3a through 3e radiated from the first laser beam source section 10 align the laser beams 3f through 3j. In order to adjust the positions of the laser beams 3a through 3j in the vertical direction, the positions of the laser beams 3a through 3e radiated from the first laser beam source section 10 are taken as the reference, and the convex lens 12 of the second laser beam source section 20 is moved along the second direction Y until the laser beams 3f through 3j radiated from the second laser beam source section 20 align the laser beams 3a through 3e. In order to tell whether or not the positions of the laser beams 3a through 3j and the points at which the laser beams 3a through 3j are focused have been adjusted accurately, a detection means may be provided to detect whether the laser beams 3a through 3j, which have been combined by the polarization beam splitter and which have passed through a converging lens (not shown), are converted to a predetermined spot. Alternatively, a semi-transparent mirror (not shown) may be positioned in the optical paths of the laser beams 3a through 3j, which have been combined, in order to pick up parts of the laser beams 3a through 3j as a monitor light. The monitor light is then converged, and a position sensor is used in order to detect whether or not the monitor light is converged to a predetermined position and to a predetermined spot diameter. In such cases, the adjustment of the positions of the convex lenses 11 and 12 based on the detected condition of the monitor light should preferably be carried out automatically.

With the beam-combining laser beam source device 1, a plurality of the semiconductor lasers 3A through 3J are classified into the first laser beam source section 10 and the second laser beam source section 20. In the first laser beam source section 10, the laser beams 3a through 3e are radiated along optical paths which are parallel and close to one another. Also, in the second laser beam source section 20, the laser beams 3f through 3j are radiated along optical paths which are parallel and close to one another. Therefore, in the first laser beam source section 10, the convex lens 11 can be positioned in the optical paths of the laser beams 3a through 3e, which optical paths are parallel and close to one another. Also, in the second laser beam source section 20, the convex lens 12 can be positioned in the optical paths of the laser beams 3f through 3j, whose optical paths are parallel and close to one another. Accordingly, the adjustment of the positions of the laser beams 3a through 3j or the like can be easily achieved only by the movement of, for example, the convex lenses 11 and 12, when the beam-combining laser beam source device 1 is assembled in the manufacturing process, and when the condition of radiation of the laser beams 3a through 3j has varied due to a change in the characteristics of the semiconductor lasers 3A through 3J with the passage of time and a change in the ambient temperature. Also, in order to adjust the positions of the laser beams 3a through 3j or the like, the convex lenses 11 and 12 may be respectively moved in two directions. Therefore, with the beam-combining laser beam source device 1, the adjustment can be carried out with a cheaper movement means than with the conventional technique wherein optical elements are moved in three directions.

Both the single common lens of the first laser beam source section and the single common lens of the second laser beam source section, whose common lenses are moved in order to adjust the positions of the laser beams, may be constituted of a concave lens. The absolute values of the focal lengths of the common lenses should preferably be larger than the absolute values of the focal lengths of the other convex lenses 6, 6, ... and the concave lenses 4, 4, ... of the collimator optical systems. This is because the common lenses can be moved in comparatively large distances in order to finely adjust the positions of the laser beams 3a through 3j and their condition of convergence. In the aforesaid embodiment, each of the common lenses of the first laser beam source section and the second laser beam source section is constituted of a single lens. However, each common lens may be constituted of a plurality of lenses combined so as to have the lens effects common to the laser beams which impinge upon these lenses. In cases where the wavelengths of the laser teams radiated from the first laser beam source section and the wavelengths of the laser beams radiated from the second laser beam source section are different from each other, the beam-combining optical element which combines the laser beams radiated from the first laser beam source section with the laser beams radiated from the second laser beam source section may be constituted of a dichroic mirror, instead of the polarization beam splitter 7. Part or all of the upper plate 2A, the middle plate 2B, the lower plate 2C and the wall member 2D of the support 2 which supports the optical elements of the beam-combining laser beam source device should preferably be manufactured by an integral molding method. With the integral molding method, processing and assembly of the support 2 are facilitated, and the beam combining accuracy of the beam-combining laser beam source device can be improved because the support 2 is free of the problem caused by joined parts deviating in position due to deterioration with the passage of time.

I claim:

1. A beam-combining laser beam source device comprising a first laser beam source section and a second laser beam source section, each of which comprises:
   (i) a plurality of laser beam sources,
   (ii) a collimator optical system positioned in each of the optical paths of respective laser beams, which are radiated from the laser beam sources, in order to collimate the laser beams, and
   (iii) optical path adjusting elements respectively positioned in the optical paths of the laser beams in order to radiate the laser beams along optical paths parallel and close to one another,
   so that the laser beams radiated from the first laser beam source section and the second laser beam source section are caused to impinge upon a beam-combining optical element from different directions and are combined by the beam-combining optical element, the beam-combining optical element reflecting the laser beams radiated from one of the first laser beam source section and the second laser beam source section and transmitting the laser beams radiated from the other of the first laser beam source section and the second laser beam source section,
   wherein each of said collimator optical systems of said first laser beam source section and said second laser beam source section is constituted of lens groups, each of which is composed of a plurality of lenses corresponding to each of said laser beam sources, and a common lens positioned so that the laser beams, which have been radiated from said optical path adjusting elements along the optical paths parallel and close to one another, impinge upon said common lens,
   the common lens of said first laser beam source section is moveable along a first direction which is parallel to the optical axis of said common lens, and along a second direction which is normal to said optical axis,
   the common lens of said second laser beam source section is moveable along a first direction which is parallel to the optical axis of said common lens, and along a second direction which is normal to said optical axis, and
   the laser beams which have been radiated from said first laser beam source section and the laser beams which have been radiated from said second laser beam source section are moved along directions normal to each other in the optical paths of the laser beams, which have been combined, by the movement of said common lens of said first laser beam source section along said second direction and the movement of said common lens of said second laser beam source section along said second direction.

2. A device as defined in claim 1 wherein the direction in which the laser beams radiated from said first laser beam source section are polarized and the direction in which the laser beams radiated from said second laser beam source section are polarized are normal to each other, and said beam-combining optical element is constituted of a polarization beam splitter.

3. A device as defined in claim 1 wherein the wavelengths of the laser beams radiated from said first laser beam source section and the wavelengths of the laser beams radiated from said second laser beam source section are different from each other, and said beam-combining optical element is constituted of a dichroic mirror.

4. A device as defined in claim 1 wherein each of said common lenses of said first laser beam source section and said second laser beam source section is constituted of a plurality of lenses which are positioned so that the laser beams radiated from the corresponding laser beam source section impinge upon the lenses, and the lenses have like effects common to the laser beams and are moved together with one another.

5. A device as defined in claim 1 wherein the absolute value of the focal length of said common lens of said first laser beam source section is larger than the absolute values of the focal lengths of the other lenses of said collimator optical system of said first laser beam source section, and/or the absolute value of the focal length of said common lens of said second laser beam source section is larger than the absolute values of the focal lengths of the other lenses of said collimator optical system of said second laser beam source section.

6. A device as defined in claim 1 wherein said laser beam sources, said collimator optical systems, and said optical path adjusting elements of said first laser beam source section and said second laser beam source section are supported on a single support.

* * * * *